United States Patent [19]
Henley et al.

[11] Patent Number: 6,010,579
[45] Date of Patent: Jan. 4, 2000

[54] REUSABLE SUBSTRATE FOR THIN FILM SEPARATION

[75] Inventors: Francois J. Henley, Los Gatos; Nathan W. Cheung, Albany, both of Calif.

[73] Assignee: Silicon Genesis Corporation, Campbell, Calif.

[21] Appl. No.: 09/026,035

[22] Filed: Feb. 19, 1998

Related U.S. Application Data

[60] Provisional application No. 60/046,276, May 12, 1997.

[51] Int. Cl.$^7$ .................................................. H01L 21/00
[52] U.S. Cl. ......................................................... 148/33.2
[58] Field of Search ........................... 148/33.2, DIG. 11, 148/33.1; 438/350, 362, 313, 366

[56] References Cited

U.S. PATENT DOCUMENTS

| | | | |
|---|---|---|---|
| 3,117,022 | 1/1964 | Bronson et al. | 117/212 |
| 3,225,820 | 12/1965 | Riordan | 165/26 |
| 3,551,213 | 12/1970 | Boyle | 148/1.5 |
| 3,786,359 | 1/1974 | King | 328/233 |
| 3,806,380 | 4/1974 | Kitada et al. | 148/159 |
| 3,832,219 | 8/1974 | Nelson et al. | 117/93.3 |
| 3,900,636 | 8/1975 | Curry et al. | 427/38 |
| 3,915,757 | 10/1975 | Engel | 148/6 |
| 3,957,107 | 5/1976 | Altoz et al. | 165/32 |
| 3,993,909 | 11/1976 | Drews et al. | 250/492 A |

(List continued on next page.)

FOREIGN PATENT DOCUMENTS

| | | | |
|---|---|---|---|
| 0084287 | 7/1983 | European Pat. Off. | G05D 23/01 |
| 0099778 | 2/1984 | European Pat. Off. | H01J 37/20 |
| 0155875 | 2/1984 | European Pat. Off. | H01J 37/317 |
| 0112238 | 6/1984 | European Pat. Off. | H01J 37/317 |
| 0164281 | 12/1985 | European Pat. Off. | H01L 21/76 |

(List continued on next page.)

OTHER PUBLICATIONS

Carter, G. et al., "The Collection of Ions Implanted in Semiconductors", *Radiation Effects,* Sep. 1972. vol. 16, No. 1–2, pp. 107–114. Abstract Only.

B.H. Lee et al., "A Novel Pattern Transfer Process for Bonded SOI Giga–bit DRAMSs," 1996 IEEE Int'l. SOI Conference Proceedings, IEEE Electron Devices Society, pp. 1996.

Chu, Paul K. et al., "Recent Applications of Plasma Immersion Ion Implantation," Semiconductor International, pp. 165–172, 1996.

Alles, Michael et al., "Thin Film Silicon on Insulator: An Enabling Technology," Semiconductor International, pp. 67–72, 1997.

Chu, Paul K., "Synthesis of SOI Materials Using Plasma Immersion Ion Implantation," Mat. Res. Soc. Symp. Proc. vol. 438 © 1997 Materials Research Society, pp. 333–343, 1997.

(List continued on next page.)

*Primary Examiner*—Charles Bowers
*Assistant Examiner*—Craig Thompson
*Attorney, Agent, or Firm*—Townsend and Townsend and Crew LLP

[57] ABSTRACT

A donor substrate (10) for forming multiple thin films of material (12). In one embodiment, a first thin film of material is separated or cleaved from a donor substrate by introducing energetic particles (22) through a surface of a donor substrate (10) to a selected depth (20) underneath the surface, where the particles have a relatively high concentration to define donor substrate material (12) above the selected depth. Energy is provided to a selected region of the substrate to cleave a thin film of material from the donor substrate. Particles are introduced again into the donor substrate underneath a fresh, or cleaved, surface of the donor substrate. A second thin film of material is then cleaved from the donor substrate.

15 Claims, 6 Drawing Sheets

U.S. PATENT DOCUMENTS

| | | | |
|---|---|---|---|
| 4,006,340 | 2/1977 | Gorinas | 219/121 |
| 4,039,416 | 8/1977 | White | 204/192 |
| 4,074,139 | 2/1978 | Pankove | 250/492 A |
| 4,107,350 | 8/1978 | Berg et al. | 427/38 |
| 4,108,751 | 8/1978 | King | 204/192 N |
| 4,116,751 | 9/1978 | Zaromb . | |
| 4,121,334 | 10/1978 | Wallis | 29/589 |
| 4,170,662 | 10/1979 | Weiss et al. | 427/38 |
| 4,252,837 | 2/1981 | Auton | 427/39 |
| 4,274,004 | 6/1981 | Kanai | 250/442 |
| 4,342,631 | 8/1982 | White et al. | 204/192 |
| 4,346,123 | 8/1982 | Kaufmann | 427/38 |
| 4,361,600 | 11/1982 | Brown | 427/93 |
| 4,368,083 | 1/1983 | Bruel et al. | 148/1.5 |
| 4,412,868 | 11/1983 | Brown et al. | 148/1.5 |
| 4,452,644 | 6/1984 | Bruel et al. | 148/1.5 |
| 4,468,309 | 8/1984 | White | 204/192 |
| 4,471,003 | 9/1984 | Cann | 427/34 |
| 4,486,247 | 12/1984 | Ecer et al. | 148/31.5 |
| 4,490,190 | 12/1984 | Speri | 148/16.6 |
| 4,500,563 | 2/1985 | Ellenberger et al. | 427/38 |
| 4,508,056 | 4/1985 | Bruel et al. | 118/730 |
| 4,536,657 | 8/1985 | Bruel | 250/492.2 |
| 4,566,403 | 1/1986 | Fournier | 118/718 |
| 4,567,505 | 1/1986 | Pease | 357/81 |
| 4,568,563 | 2/1986 | Jackson et al. | 427/40 |
| 4,585,945 | 4/1986 | Bruel et al. | 250/492.2 |
| 4,684,535 | 8/1987 | Heinecke et al. | 427/38 |
| 4,704,302 | 11/1987 | Bruel et al. | 427/38 |
| 4,717,683 | 1/1988 | Parrillo et al. | 437/34 |
| 4,764,394 | 8/1988 | Conrad | 427/38 |
| 4,837,172 | 6/1989 | Mizuno et al. | 437/11 |
| 4,846,928 | 7/1989 | Dolins et al. | 156/626 |
| 4,847,792 | 7/1989 | Barna et al. | 364/552 |
| 4,853,250 | 8/1989 | Boulos et al. | 427/34 |
| 4,883,561 | 11/1989 | Gmitter et al. . | |
| 4,887,005 | 12/1989 | Rough et al. | 315/111.21 |
| 4,894,709 | 1/1990 | Phillips et al. | 357/82 |
| 4,931,405 | 6/1990 | Kamijo et al. | 437/12 |
| 4,948,458 | 8/1990 | Ogle | 156/643 |
| 4,952,273 | 8/1990 | Popov | 156/643 |
| 4,960,073 | 10/1990 | Suzuki et al. | 118/723 |
| 4,982,090 | 1/1991 | Wittmaack . | |
| 4,996,077 | 2/1991 | Moslehi et al. | 427/38 |
| 5,015,353 | 5/1991 | Hubler et al. | 204/192.31 |
| 5,034,343 | 7/1991 | Rouse et al. | 437/86 |
| 5,070,040 | 12/1991 | Pankove | 437/209 |
| 5,082,793 | 1/1992 | Li | 437/26 |
| 5,110,748 | 5/1992 | Sarma | 437/51 |
| 5,133,826 | 7/1992 | Dandl | 156/345 |
| 5,196,355 | 3/1993 | Wittkower | 437/24 |
| 5,198,371 | 3/1993 | Li | 437/24 |
| 5,202,095 | 4/1993 | Houchin et al. | 422/186 |
| 5,203,960 | 4/1993 | Dandl | 156/643 |
| 5,234,529 | 8/1993 | Johnson | 156/345 |
| 5,234,535 | 8/1993 | Beyer et al. . | |
| 5,242,861 | 9/1993 | Inaba . | |
| 5,250,328 | 10/1993 | Otto | 427/535 |
| 5,252,178 | 10/1993 | Moslehi | 156/643 |
| 5,269,880 | 12/1993 | Jolly et al. . | |
| 5,273,610 | 12/1993 | Thomas, III et al. | 156/345 |
| 5,304,509 | 4/1994 | Sopori | 437/173 |
| 5,342,472 | 8/1994 | Imahashi et al. | 156/345 |
| 5,354,381 | 10/1994 | Sheng . | |
| 5,368,710 | 11/1994 | Chen et al. | 204/192.32 |
| 5,370,765 | 12/1994 | Dandl | 156/643 |
| 5,374,564 | 12/1994 | Bruel | 438/350 |
| 5,376,560 | 12/1994 | Aronowitz et al. | 437/24 |
| 5,404,079 | 4/1995 | Ohkuni et al. | 315/111.81 |
| 5,405,480 | 4/1995 | Benzing et al. | 156/345 |
| 5,411,592 | 5/1995 | Ovshinsky et al. | 118/718 |
| 5,435,880 | 7/1995 | Minato et al. | 156/345 |
| 5,476,691 | 12/1995 | Komvopoulos et al. . | |
| 5,487,785 | 1/1996 | Horiike et al. | 118/723 |
| 5,494,835 | 2/1996 | Bruel | 437/24 |
| 5,504,328 | 4/1996 | Bonser | 250/288 |
| 5,558,718 | 9/1996 | Leung . | |
| 5,559,043 | 9/1996 | Bruel | 437/24 |
| 5,653,811 | 8/1997 | Chan | 118/723 |
| 5,710,057 | 1/1998 | Kenney . | |
| 5,714,395 | 2/1998 | Bruel | 438/528 |

FOREIGN PATENT DOCUMENTS

| | | | |
|---|---|---|---|
| 0112230 | 4/1987 | European Pat. Off. | H01J 37/317 |
| 0181249 | 6/1989 | European Pat. Off. | D21C 9/00 |
| 0504714 | 9/1992 | European Pat. Off. | H01L 21/76 |
| 0533551 | 3/1993 | European Pat. Off. | H01L 21/265 |
| 0355913 | 12/1993 | European Pat. Off. | H01L 21/316 |
| 0665588 | 2/1995 | European Pat. Off. | H01L 21/76 |
| 0660140 | 6/1995 | European Pat. Off. | G02B 5/18 |
| 0665587 | 8/1995 | European Pat. Off. | H01L 21/68 |
| 0379828 | 9/1995 | European Pat. Off. | H01J 37/32 |
| 0459177 | 12/1995 | European Pat. Off. | H01J 37/32 |
| 0703609 | 3/1996 | European Pat. Off. | H01L 21/762 |
| 0763849 | 3/1997 | European Pat. Off. | H01L 21/20 |
| 1558881 | 1/1969 | France . | |
| 2261802 | 2/1974 | France | B01D 59/00 |
| 2235474 | 4/1974 | France | H01J 27/00 |
| 2298880 | 1/1975 | France . | |
| 2266304 | 4/1975 | France | H01L 21/463 |
| 2519437 | 1/1982 | France | G05D 23/01 |
| 2529383 | 6/1982 | France | H01J 7/20 |
| 2537768 | 8/1982 | France | G21K 1/00 |
| 2537777 | 12/1982 | France | H01L 21/265 |
| 2560426 | 2/1984 | France | G21K 5/00 |
| 2563377 | 4/1984 | France | H01L 21/223 |
| 2575601 | 12/1984 | France | H01L 21/66 |
| 2681472 | 9/1991 | France | H01L 21/265 |
| 2714524 | 12/1993 | France | H01L 21/265 |
| 2715501 | 1/1994 | France | H01L 21/20 |
| 2715502 | 1/1994 | France | H01L 21/302 |
| 2715503 | 1/1994 | France | H01L 23/13 |
| 2720189 | 5/1994 | France | H01L 21/322 |
| 2725074 | 9/1994 | France | H01L 21/20 |
| 60-235434 | 11/1958 | Japan | H01L 21/76 |
| 53-104156 | 9/1978 | Japan | H01L 21/322 |
| 58-144475 | 8/1983 | Japan | C23C 15/00 |
| 60-83591 | 10/1983 | Japan | C12P 7/18 |
| 59-19394 | 1/1984 | Japan | H04K 3/34 |
| 59-46750 | 3/1984 | Japan | H01J 37/317 |
| 59-54217A | 3/1984 | Japan | H01L 21/20 |
| 59-114744 | 7/1984 | Japan | H01J 37/317 |
| 59-139539 | 8/1984 | Japan | H01J 37/30 |
| 60-207237 | 10/1985 | Japan | H01J 37/05 |
| 4-76503 | 7/1990 | Japan | G02B 6/00 |
| 4-246594 | 9/1992 | Japan | B41N 1/12 |
| 5-211128 | 8/1993 | Japan | H01L 21/205 |
| 7-215800 | 8/1995 | Japan | C30B 33/00 |
| 7-254690 | 10/1995 | Japan | H01L 27/12 |
| 7-263291 | 10/1995 | Japan | H01L 21/02 |
| 8-97389 | 4/1996 | Japan | H01L 27/12 |
| 2221991 | 7/1989 | United Kingdom | H01L 21/76 |
| WO 95/10718 | 4/1995 | WIPO | F16H 48/20 |
| WO 95/20824 | 8/1995 | WIPO | H01L 21/58 |
| WO 95/31825 | 11/1995 | WIPO | H01L 21/76 |

OTHER PUBLICATIONS

Picraux, S. Thomas et al., "Ion Implantation of Surfaces," Scientific American, vol. 252, No. 3., pp. 102–113, 1985.

U.S. Dept. of Energy, "The Fusion Connection: . . . ", Plasma Coating, pp. 6–7, 1985.

Cassidy, Victor M., "Ion Implantation Process Toughens Metalworking Tools," Modern Metals, pp. 65–67, 1984.

Sioshansi, Piran, "Ion Beam Modification of Materials for Industry," Thin Solid Film, vol. 118, pp. 61–71, 1984.

Hulett, D.M. et al., "Ion Nitriding and Ion Implantation: A Comparison," Metal Progress, pp. 18–21, 1985.

Renier, M. et al., "A New Low–Engergy Ion Implanter for Bombardment of Cylindrical Surfaces," Vacuum, vol. 35, No. 12, pp. 577–578, 1985.

Basta, Nicholas, "Ion–Beam Implantation," High Technology, 1985.

Patent Abstracts of Japan, vol. 7, No. 107 (E–174), May 11, 1993, JP–58–030145 A, Feb. 22, 1983.

Matsuda et al., "Large Diameter Ion Beam Implantation System," Nuclear Intruments and Methods, vol. B21, pp. 314–316, 1987.

Stanley Wolf Ph. D., Silicon Processing for the VLSI Era (vol. 2), pp. 66–79.

Cheung, N.W., "Plasma Immersion Ion Implantation for Semiconductor Processing," Material Chemistry and Physics, vol. 46/2–3, pp. 132–139 (1996).

X. Lu et al., "SOI Material Technology Using Plasma Immersion Ion Implantation," Proceedings 1996 IEEE International SOI Conference (Oct. 1996).

Veldkamp, W.B. et al., "Binary Optics," Scientific American, pp. 50–55, May 1992.

I.B.M. Technical Disclosure Bulletinm, vol. 29, No. 3, p. 1416, Aug. 1986.

Li, J., "Novel Semiconductor Substrate Formed by Hydrogen Ion Implantation into Silicon," Appl. Phys. Lett., vol. 55, No. 21, pp. 2223–2224, Nov. 20, 1989.

Burggraff, Peter, "Advanced Plasma Source: What's Working?" Semiconductor International, pp. 56–59, May 1994.

Chu, P.K. et al., Plasma Immersion Ion Implantation—A Fledgling Technique for Semiconductor Processing, Materials Science and Engineering Reports: A Review Journal, pp. 207–280, vol. R17, Nos. 6–7, Nov. 30, 1996.

Moreau, Wayne M., "Semiconductor Lithography, Principles, Practices, and Materials," Plenum Press, 1988.

REUSABLE SUBSTRATE FOR THIN FILM SEPARATION

CROSS REFERENCE TO RELATED APPLICATIONS

This application claims priority from the provisional patent application entitled A CONTROLLED CLEAVAGE PROCESS AND RESULTING DEVICE, filed May 12, 1997 and assigned application Ser. No. 60/046,276, the disclosure of which is hereby incorporated in its entirety for all purposes. This application is being filed on the same date as related application Ser. No. 09/026,032 entitled "A PRESSURIZED MICROBUBBLE THIN FILM SEPARATION PROCESS USING A REUSABLE SUBSTRATE" and application Ser. No. 09/026,113 entitled "A CONTROLLED CLEAVAGE THIN FILM SEPARATION PROCESS USING A REUSABLE SUBSTRATE".

BACKGROUND OF THE INVENTION

The present invention relates to the manufacture of substrates. More particularly, the invention provides a reusable donor substrate for separating a thin film of material from. The thin film can be used in the fabrication of a silicon-on-insulator substrate for semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

Wafers for electronic device fabrication are often cut from an ingot, or boule, of material with an abrasive saw. The wafer often serves as both a mechanical substrate and a semiconductor material to form electronic devices in or on. One of the most common examples of this is cutting silicon wafers from a silicon ingot. The wafers are typically polished to a very fine surface finish after removing the mechanical damage left by the abrasive saw. In some processes, devices are fabricated directly in or on the silicon wafer. In other processes, a layer of semiconductor material is grown, for example by epitaxy, on the wafer. An epitaxial layer may provide lower impurity concentrations, or be of a different semiconductor type than the wafer. The devices are formed in what is known as the "active" layer, which is typically only a micron or so thick.

Sawing wafers from an ingot has several disadvantages. First, a significant amount of material may be lost due to the width, or kerf, of the saw blade. Second, the wafers must be cut thick enough to survive a typical circuit fabrication process. As the wafers get larger and larger, the required thickness to maintain sufficient strength to be compatible with given wafer handling methods increases. Third, the polishing process to remove the saw marks takes longer and removes yet more precious material than would be required if an alternative method existed.

The desire to conserve material lost to the sawing and polishing operations increases as the value of an ingot increases. Single-crystal silicon ingots are now being produced with diameters of twelve inches. Each wafer cut and polished from these ingots can cost over a thousand dollars. Ingots of other materials are also being produced. Some of these materials may be difficult to produce as a single crystal, or may require very rare and expensive starting materials, or consume a significant amount of energy to produce. Using such valuable material to provide simple mechanical support for the thin active layer is very undesirable, as is losing material to the sawing and polishing operations.

Several materials are processed by cleaving, rather than sawing. Examples include scribing and breaking a piece of glass, or cleaving a diamond with a chisel and mallet. A crack propagates through the material at the desired location to separate one portion of material from another. Cleaving is especially attractive to separate materials that are difficult to saw, for example, very hard materials. Although the cleaving techniques described above are satisfactory, for the most part, as applied to cutting diamonds or household glass, they have severe limitations in the fabrication of semiconductor substrates. For instance, the above techniques are often "rough" and cannot be used with great precision in fabrication of the thin layers desired for device fabrication, or the like.

From the above, it is seen that a technique for separating a thin film of material from a substrate which is cost effective and efficient is often desirable.

SUMMARY OF THE INVENTION

According to the present invention, a technique for removing thin films of material from a reusable substrate is provided. This technique separates thin films of material from a donor substrate by implanting particles, such as hydrogen ions, into the donor substrate, and then separating the thin film of material above the layer of implanted particles. A second implant and separation process is then performed to remove multiple films from a single substrate.

In a specific embodiment, the present invention provides a process for forming a film of material from a donor substrate, which is reusable, using a controlled cleaving process. That process includes a step of introducing energetic particles (e.g., charged or neutral molecules, atoms, or electrons having sufficient kinetic energy) through a surface of a donor substrate to a selected depth underneath the surface, where the particles are at a relatively high concentration to define a thickness of donor substrate material (e.g., thin film of detachable material) above the selected depth. To cleave the donor substrate material, the method provides energy to a selected region of the donor substrate to initiate a controlled cleaving action in the donor substrate, whereupon the cleaving action is made using a propagating cleave front(s) to free the donor material from a remaining portion of the donor substrate. The remaining portion of the donor substrate is reused in another cleaving process, if desired.

In another embodiment, a layer of microbubbles is formed at a selected depth in the substrate. The substrate is globally heated and pressure in the bubbles eventually shatters the substrate material generally in the plane of the microbubbles.

The present invention separates several thins films of material from a single, reusable donor substrate. The thin films can be used for fabrication of, for example, a silicon-on-insulator or silicon-on-silicon wafer. A planarizing layer of silicon oxide may be formed on the donor substrate after each cleaving step to facilitate bonding the donor wafer to a transfer wafer, or stiffener. Accordingly, the present invention provides a reusable substrate, thereby saving costs and reduces the amount of scrap material.

In most of the embodiments, a cleave is initiated by subjecting the material with sufficient energy to fracture the material in one region, causing a cleave front, without uncontrolled shattering or cracking. The cleave front formation energy ($E_c$) must often be made lower than the bulk material fracture energy ($E_{mat}$) at each region to avoid shattering or cracking the material. The directional energy impulse vector in diamond cutting or the scribe line in glass cutting are, for example, the means in which the cleave energy is reduced to allow the controlled creation and propagation of a cleave front. The cleave front is in itself a higher stress region and once created, its propagation requires a lower energy to further cleave the material from this initial region of fracture. The energy required to propagate the cleave front is called the cleave front propagation energy ($E_p$). The relationship can be expressed as:

$$E_c = E_p + [\text{cleave front stress energy}]$$

A controlled cleaving process is realized by reducing $E_p$ along a favored direction(s) above all others and limiting the available energy to be below the $E_p$ of other undesired directions. In any cleave process, a better cleave surface finish occurs when the cleave process occurs through only one expanding cleave front, although multiple cleave fronts do work.

This technique uses a relatively low temperature during the controlled cleaving process of the thin film to reduce temperature excursions of the separated film, donor substrate, or multi-material films according to other embodiments. This lower temperature approach allows for more material and process latitude such as, for example, cleaving and bonding of materials having substantially different thermal expansion coefficients. In other embodiments, the present invention limits energy or stress in the substrate to a value below a cleave initiation energy, which generally removes a possibility of creating random cleave initiation sites or fronts. This reduces cleave damage (e.g., pits, crystalline defects, breakage, cracks, steps, voids, excessive roughness) often caused in pre-existing techniques. Moreover, the present invention reduces damage caused by higher than necessary stress or pressure effects and nucleation sites caused by the energetic particles as compared to pre-existing techniques.

The present invention achieves these benefits and others in the context of known process technology. However, a further understanding of the nature and advantages of the present invention may be realized by reference to the latter portions of the specification and attached drawings.

DESCRIPTION OF SPECIFIC EMBODIMENTS

The present invention provides a technique for removing a thin film of material from a substrate while preventing a possibility of damage to the thin material film and/or a remaining portion of the substrate. The thin film of material is attached to or can be attached to a target substrate to form, for example, a silicon-on-insulator wafer. The thin film of material can also be used for a variety of other applications. The invention will be better understood by reference to the Figs. and the descriptions below.

1. Controlled Cleaving Techniques

Figure 1:
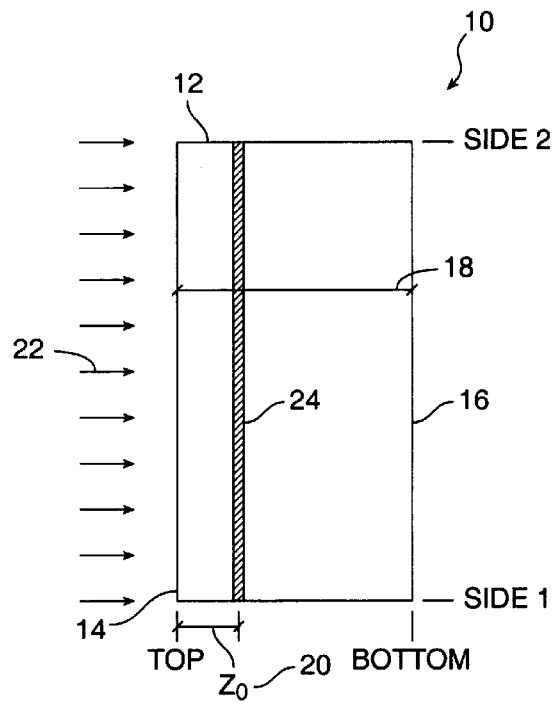
FIGS. 1–8 are simplified diagrams illustrating a controlled cleaving technique according to an embodiment of the present invention.

FIG. 1 is a simplified cross-sectional view diagram of a substrate 10 according to the present invention. The diagram is merely an illustration and should not limit the scope of the claims herein. As merely an example, substrate 10 is a silicon wafer which includes a material region 12 to be removed, which is a thin relatively uniform film derived from the substrate material. The silicon wafer 10 includes a top surface 14, a bottom surface 16, and a thickness 18. Substrate 10 also has a first side (side 1) and a second side (side 2) (which are also referenced below in the Figs.). Material region 12 also includes a thickness 20, within the thickness 18 of the silicon wafer. The present invention provides a novel technique for removing the material region 12 using the following sequence of steps.

Selected energetic particles implant 22 through the top surface 14 of the silicon wafer to a selected depth 24, which defines the thickness 20 of the material region 12, termed the thin film of material. A variety of techniques can be used to implant the energetic particles into the silicon wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique or an ion shower technique. Examples of plasma immersion implantation techniques are described in "Recent Applications of Plasma Immersion Ion Implantation," Paul K. Chu, Chung Chan, and Nathan W. Cheung, SEMICONDUCTOR INTERNATIONAL, pp. 165–172, June 1996, and "Plasma Immersion Ion Implantation—A Fledgling Technique for Semiconductor Processing,", P. K. Chu, S. Qin, C. Chan, N. W. Cheung, and L. A. Larson, MATERIALS SCIENCE AND ENGINEERING REPORTS: A REVIEW JOURNAL, pp. 207–280 Volume R17, Nos. 6–7, (Nov. 30, 1996), which are both hereby incorporated by reference for all purposes. Of course, techniques used depend upon the application.

Depending upon the application, smaller mass particles are generally selected to reduce a possibility of damage to the material region 12. That is, smaller mass particles easily travel through the substrate material to the selected depth without substantially damaging the material region that the particles traverse through. For example, the smaller mass particles (or energetic particles) can be almost any charged (e.g., positive or negative) and/or neutral atoms or molecules, or electrons, or the like. In a specific embodiment, the particles can be neutral and/or charged particles including ions such as ions of hydrogen and its isotopes, rare gas ions such as helium and its isotopes, and neon. The particles can also be derived from compounds such as gases, e.g., hydrogen gas, water vapor, methane, and hydrogen compounds, and other light atomic mass particles. Alternatively, the particles can be any combination of the above particles, and/or ions and/or molecular species and/or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about –200 to about 600° C., and is preferably less than about 400° C. to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can be repaired by subsequent heat treatment, e.g., thermal annealing or rapid thermal annealing.

Figure 2:
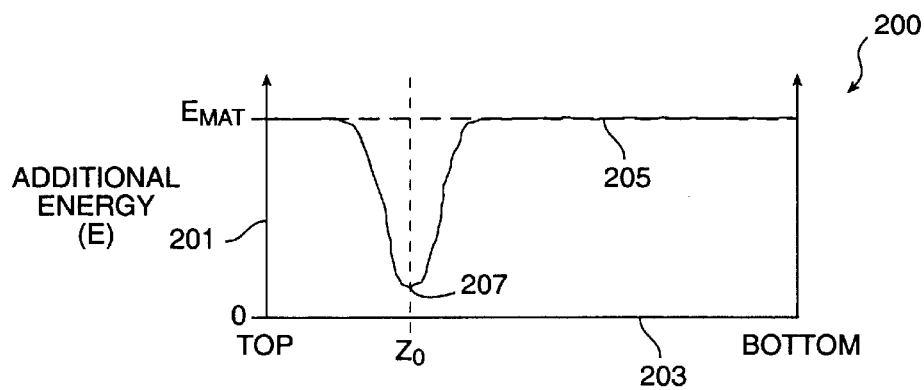

FIG. 2 is a simplified energy diagram 200 along a cross-section of the implanted substrate 10 according to the present invention. The diagram is merely an illustration and should not limit the scope of the claims herein. The simplified diagram includes a vertical axis 201 that represents an energy level (E) (or additional energy) to cause a cleave in the substrate. A horizontal axis 203 represents a depth or distance from the bottom of the wafer to the top of the wafer. After implanting particles into the wafer, the substrate has an average cleave energy represented as E 205, which is the amount of energy needed to cleave the wafer along various cross-sectional regions along the wafer depth. The cleave energy ($E_t$) is equal to the bulk material fracture energy ($E_{mat}$) in non-implanted regions. At the selected depth 20, energy ($E_{cz}$) 207 is lower since the implanted particles essentially break or weaken bonds in the crystalline structure (or increase stress caused by a presence of particles also contributing to lower energy ($E_{cz}$) 207 of the substrate) to lower the amount of energy needed to cleave the substrate at the selected depth. This takes advantage of the lower energy (or increased stress) at the selected depth to cleave the thin film in a controlled manner.

Figure 3:
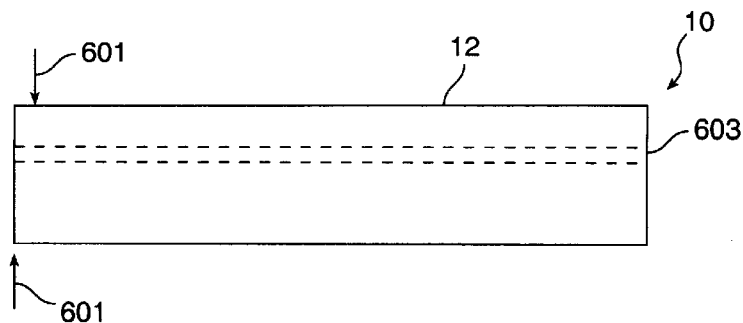

FIG. 3 is a simplified cross-sectional view of an implanted substrate 10 using selective positioning of cleave energy according to the present invention. This diagram is merely an illustration, and should not limit the scope of the claims herein. The implanted wafer undergoes a step of selective energy placement or positioning or targeting which provides a controlled cleaving action of the material region 12 at the selected depth. The impulse or impulses are provided using energy sources. Examples of sources include, among others, a chemical source, a mechanical source, an electrical source, and a thermal sink or source. The chemical source can include a variety such as particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electromagnetic field, an electron beam, a thermoelectric heating, a furnace, and the like. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application.

Figure 4:
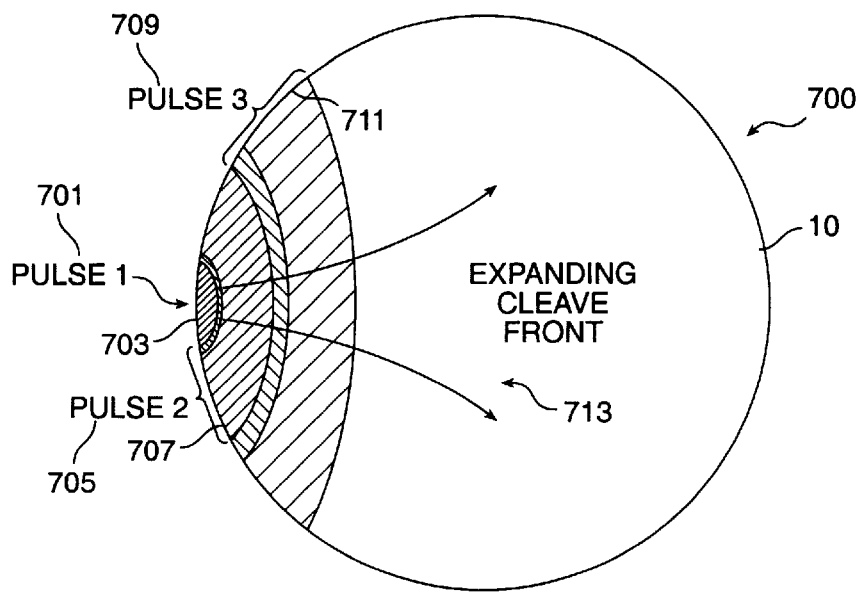

In a specific embodiment, the present invention provides a controlledpropagating cleave. The controlled-propagating cleave uses multiple successive impulses to initiate and perhaps propagate a cleaving process 700, as illustrated by FIG. 4. This diagram is merely an illustration, and should not limit the scope of the claims herein. As shown, the impulse is directed at an edge of the substrate, which propagates a cleave front toward the center of the substrate to remove the material layer from the substrate. In this embodiment, a source applies multiple pulses (i.e., pulse 1, 2, and 3) successively to the substrate. Pulse 1 701 is directed to an edge 703 of the substrate to initiate the cleave action. Pulse 2 705 is also directed at the edge 707 on one side of pulse 1 to expand the cleave front. Pulse 3 709 is directed to an opposite edge 711 of pulse 1 along the expanding cleave front to further remove the material layer from the substrate. The combination of these impulses or pulses provides a controlled cleaving action 713 of the material layer from the substrate.

Figure 5:
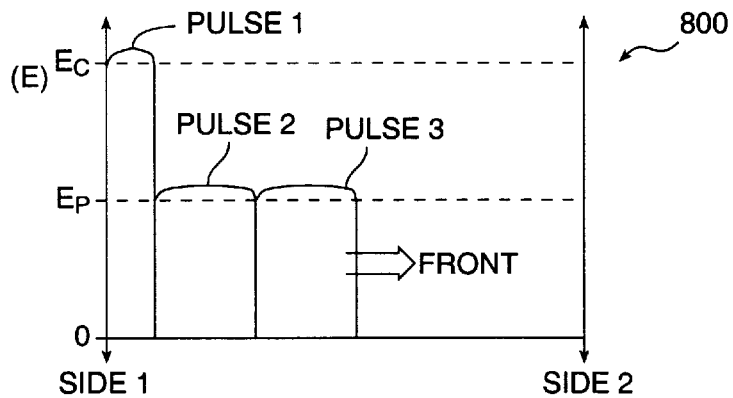

FIG. 5 is a simplified illustration of selected energies 800 from the pulses in the preceding embodiment for the controlled-propagating cleave. This diagram is merely an illustration, and should not limit the scope of the claims herein. As shown, the pulse 1 has an energy level which exceeds average cleaving energy (E), which is the necessary energy for initiating the cleaving action. Pulses 2 and 3 are made using lower energy levels along the cleave front to maintain or sustain the cleaving action. In a specific embodiment, the pulse is a laser pulse where an impinging beam heats a selected region of the substrate through a pulse and a thermal pulse gradient causes supplemental stresses which together exceed cleave formation or propagation energies, which create a single cleave front. In preferred embodiments, the impinging beam heats and causes a thermal pulse gradient simultaneously, which exceed cleave energy formation or propagation energies. More preferably, the impinging beam cools and causes a thermal pulse gradient simultaneously, which exceed cleave energy formation or propagation energies.

Optionally, a built-in energy state of the substrate or stress can be globally raised toward the energy level necessary to initiate the cleaving action, but not enough to initiate the cleaving action before directing the multiple successive impulses to the substrate according to the present invention. The global energy state of the substrate can be raised or lowered using a variety of sources such as chemical, mechanical, thermal (sink or source), or electrical, alone or in combination. The chemical source can include a variety such as particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermoelectric heating, and a furnace. The thermal sink can be selected from a fluid jet, a liquid jet, a gas jet, a cryogenic fluid, a super-cooled liquid, a thermoelectric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used also depends upon the application. As noted, the global source increases a level of energy or stress in the material region without initiating a cleaving action in the material region before providing energy to initiate the controlled cleaving action.

In a specific embodiment, an energy source elevates an energy level of the substrate cleave plane above its cleave front propagation energy but is insufficient to cause self-initiation of a cleave front. In particular, a thermal energy source or sink in the form of heat or lack of heat (e.g., cooling source) can be applied globally to the substrate to increase the energy state or stress level of the substrate without initiating a cleave front. Alternatively, the energy source can be electrical, chemical, or mechanical. A directed energy source provides an application of energy to a selected region of the substrate material to initiate a cleave front which selfpropagates through the implanted region of the substrate until the thin film of material is removed. A variety of techniques can be used to initiate the cleave action. These techniques are described by way of the Figs. below.

Figure 6:
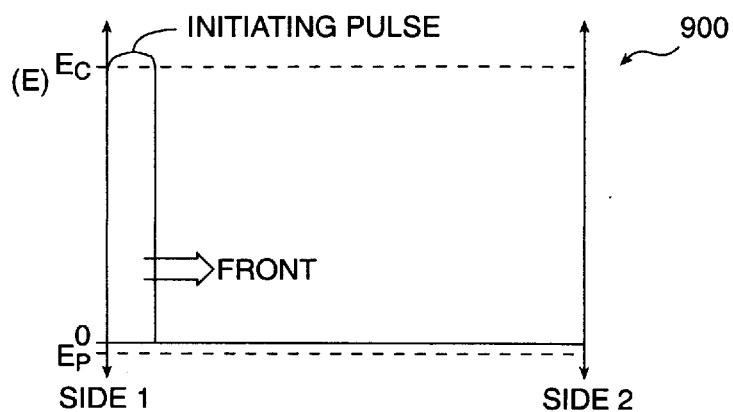

FIG. 6 is a simplified illustration of an energy state 900 for a controlled cleaving action using a single controlled source according to an aspect of the present invention. This diagram is merely an illustration, and should not limit the scope of the claims herein. In this embodiment, the energy level or state of the substrate is raised using a global energy source above the cleave front propagation energy state, but is lower than the energy state necessary to initiate the cleave front. To initiate the cleave front, an energy source such as a laser directs a beam in the form of a pulse at an edge of the substrate to initiate the cleaving action. Alternatively, the energy source can be a cooling fluid (e.g., liquid, gas) that directs a cooling medium in the form of a pulse at an edge of the substrate to initiate the cleaving action. The global energy source maintains the cleaving action which generally requires a lower energy level than the initiation energy.

Figure 7:
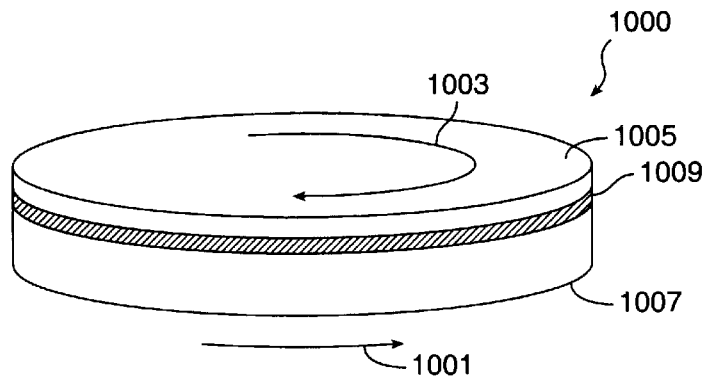
Figure 8:
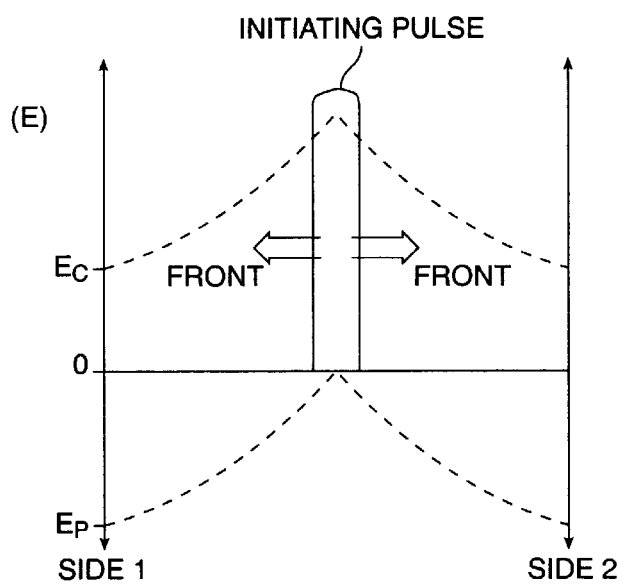

An alternative aspect of the invention is illustrated by FIGS. 7 and 8. FIG. 7 is a simplified illustration of an implanted substrate 1000 undergoing rotational forces 1001, 1003. This diagram is merely an illustration, and should not limit the scope of the claims herein. As shown, the substrate includes a top surface 1005, a bottom surface 1007, and an implanted region 1009 at a selected depth. An energy source increases a global energy level of the substrate using a light beam or heat source to a level above the cleave front propagation energy state, but lower than the energy state necessary to initiate the cleave front. The substrate undergoes a rotational force turning clockwise 1001 on top surface and a rotational force turning counter-clockwise 1003 on the bottom surface which creates stress at the implanted region 1009 to initiate a cleave front. Alternatively, the top surface undergoes a counter-clockwise rotational force and the bottom surface undergoes a clockwise rotational force. Of course, the direction of the force generally does not matter in this embodiment.

FIG. 8 is a simplified diagram of an energy state 1100 for the controlled cleaving action using the rotational force according to the present invention. This diagram is merely an illustration, and should not limit the scope of the claims herein. As previously noted, the energy level or state of the substrate is raised using a global energy source (e.g., thermal, beam) above the cleave front propagation energy state, but is lower than the energy state necessary to initiate the cleave front. To initiate the cleave front, a mechanical energy means such as rotational force applied to the implanted region initiates the cleave front. In particular, rotational force applied to the implanted region of the substrates creates zero stress at the center of the substrate and greatest at the periphery, essentially being proportional to the radius. In this example, the central initiating pulse causes a radially expanding cleave front to cleave the substrate.

The removed material region provides a thin film of silicon material for processing. The silicon material possesses limited surface roughness and desired planarity characteristics for use in a silicon-on-insulator substrate. In certain embodiments, the surface roughness of the detached film has features that are less than about 60 nm, or less than about 40 nm, or less than about 20 nm. Accordingly, the present invention provides thin silicon films which can be smoother and more uniform than pre-existing techniques.

In a preferred embodiment, the present invention is practiced at temperatures that are lower than those used by pre-existing techniques. In particular, the present invention does not require increasing the entire substrate temperature to initiate and sustain the cleaving action as pre-existing techniques. In some embodiments for silicon wafers and hydrogen implants, substrate temperature does not exceed about 400° C. during the cleaving process. Alternatively, substrate temperature does not exceed about 350° C. during the cleaving process. Alternatively, substrate temperature is kept substantially below implanting temperatures via a thermal sink, e.g., cooling fluid, cryogenic fluid. Accordingly, the present invention reduces a possibility of unnecessary damage from an excessive release of energy from random cleave fronts, which generally improves surface quality of a detached film(s) and/or the substrate(s). Accordingly, the present invention provides resulting films on substrates at higher overall yields and quality.

The above embodiments are described in terms of cleaving a thin film of material from a substrate. The substrate, however, can be disposed on a workpiece such as a stiffener or the like before the controlled cleaving process. The workpiece joins to a top surface or implanted surface of the substrate to provide structural support to the thin film of material during controlled cleaving processes. The workpiece can be joined to the substrate using a variety of bonding or joining techniques, e.g., electro-statics, adhesives, interatomic. Some of these bonding techniques are described herein. The workpiece can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of workpiece used will depend upon the application.

Alternatively, the substrate having the film to be detached can be temporarily disposed on a transfer substrate, such as a stiffener or the like, before the controlled cleaving process. The transfer substrate joins to a top surface or implanted surface of the substrate having the film to provide structural support to the thin film of material during controlled cleaving processes. The transfer substrate can be temporarily joined to the substrate having the film using a variety of bonding or joining techniques, e.g., electrostatics, adhesives, interatomic. Some of these bonding techniques are described herein. The transfer substrate can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of transfer substrate used will depend upon the application. Additionally, the transfer substrate can be used to remove the thin film of material from the cleaved substrate after the controlled cleaving process.

2. Another Cleaving Technique

An example of an alternative technique which may form multiple cleave fronts in a random manner is described in U.S. Pat. No. 5,374,564, which is in the name of Michel Bruel ("Bruel"), and assigned to Commissariat A l'Energie Atomique in France. Bruel generally describes a technique for cleaving an implanted wafer by global thermal treatment (i.e., thermally treating the entire plane of the implant) using thermally activated diffusion. The technique described in Bruel implants gas-forming ions into a silicon wafer to form a layer of microbubbles, and attaches a stiffener to the surface of the wafer. A global thermal treatment of the substrate generally causes a pressure effect in the layer of microbubbles that initiates multiple cleave fronts which propagate independently to separate a thin film of material, which is joined to the stiffener, to be separated from the substrate. This process results in a thin film of material with a rough surface finish on the surface of the cleaved material. It is believed that the rough surface results from the energy level for maintaining the cleave exceeding the amount required, and that the stiffener is important in maintaining the integrity of the film through the separation process.

3. Silicon-On-Insulator Process

A process for fabricating a silicon-on-insulator substrate according to the present invention may be briefly outlined as follows:

(1) Provide a donor silicon wafer (which may be coated with a dielectric material);
(2) Introduce particles into the silicon wafer to a selected depth to define a thickness of silicon film;
(3) Provide a target substrate material (which may be coated with a dielectric material);
(4) Bond the donor silicon wafer to the target substrate material by joining the implanted face to the target substrate material;
(5) Increase global stress (or energy) of implanted region at selected depth without initiating a cleaving action (optional);
(6) Provide stress (or energy) to a selected region of the bonded substrates to initiate a controlled cleaving action at the selected depth;
(7) Provide additional energy to the bonded substrates to sustain the controlled cleaving action to free the thickness of silicon film from the silicon wafer (optional);
(8) Complete bonding of donor silicon wafer to the target substrate; and
(9) Polish a surface of the thickness of silicon film.

The above sequence of steps provides a step of initiating a controlled cleaving action using an energy applied to a selected region(s) of a multi-layered substrate structure to form a cleave front(s) according to the present invention. This initiation step begins a cleaving process in a controlled manner by limiting the amount of energy applied to the substrate. Further propagation of the cleaving action can occur by providing additional energy to selected regions of the substrate to sustain the cleaving action, or using the energy from the initiation step to provide for further propagation of the cleaving action. This sequence of steps is merely an example and should not limit the scope of the claims defined herein. Further details with regard to the above sequence of steps are described in below in references to the Figs.

Figure 9:
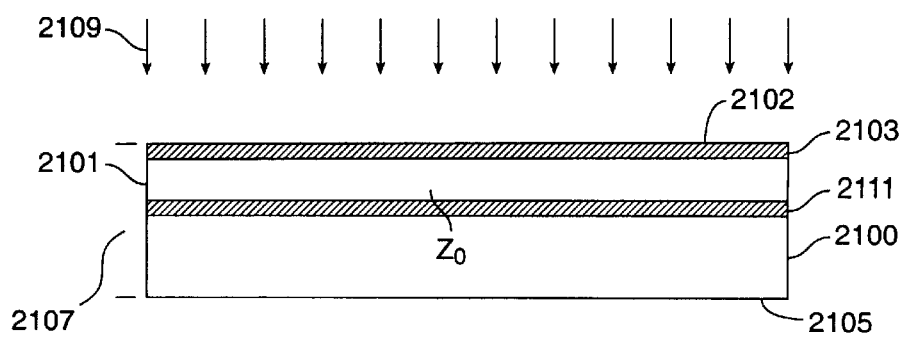

FIGS. 9–15 are simplified cross-sectional view diagrams of substrates undergoing a fabrication process for a silicon-on-insulator wafer according to the present invention. The process begins by providing a semiconductor substrate similar to the silicon wafer 2100, as shown by FIG. 9. Substrate or donor includes a material region 2101 to be removed, which is a thin relatively uniform film derived from the substrate material. The silicon wafer includes a top surface 2103, a bottom surface 2105, and a thickness 2107. Material region also includes a thickness ($z_0$), within the thickness 2107 of the silicon wafer. Optionally, a dielectric layer 2102 (e.g., silicon nitride, silicon oxide, silicon oxynitride) overlies the top surface of the substrate. The present process provides a novel technique for removing the material region 2101 using the following sequence of steps for the fabrication of a silicon-on-insulator wafer.

Selected energetic particles 2109 implant through the top surface of the silicon wafer to a selected depth, which defines the thickness of the material region, termed the thin film of material. As shown, the particles have a desired concentration 2111 at the selected depth ($z_0$). A variety of techniques can be used to implant the energetic particles into the silicon wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Of course, techniques used depend upon the application.

Depending upon the application, smaller mass particles are generally selected to reduce a possibility of damage to the material region. That is, smaller mass particles easily travel through the substrate material to the selected depth without substantially damaging the material region that the particles traversed through. For example, the smaller mass particles (or energetic particles) can be almost any charged (e.g., positive or negative) and/or neutral atoms or molecules, or electrons, or the like. In a specific embodiment, the particles can be neutral and/or charged particles including ions of hydrogen and its isotopes, rare gas ions such as helium and its isotopes, and neon. The particles can also be derived from compounds such as gases, e.g., hydrogen gas, water vapor, methane, and other hydrogen compounds, and other light atomic mass particles. Alternatively, the particles can be any combination of the above particles, and/or ions and/or molecular species and/or atomic species.

Figure 10:
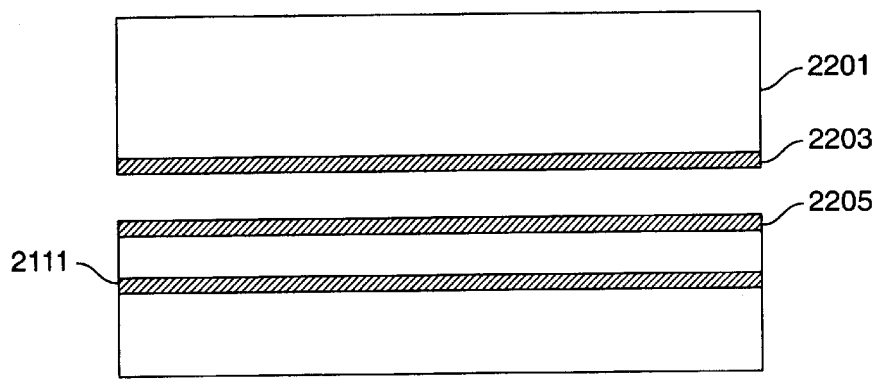

The process uses a step of joining the implanted silicon wafer to a workpiece or target wafer, as illustrated in FIG. 10. The workpiece may also be a variety of other types of substrates such as those made of a dielectric material (e.g., quartz, glass, silicon nitride, silicon dioxide), a conductive material (silicon, polysilicon, group III/V materials, metal), and plastics (e.g., polyimide-based materials). In the present example, however, the workpiece is a silicon wafer.

In a specific embodiment, the silicon wafers are joined or fused together using a low temperature thermal step. The low temperature thermal process generally ensures that the implanted particles do not place excessive stress on the material region, which can produce an uncontrolled cleave action. In one aspect, the low temperature bonding process occurs by a self-bonding process. In particular, one wafer is stripped to remove oxidation therefrom (or one wafer is not oxidized). A cleaning solution treats the surface of the wafer to form O—H bonds on the wafer surface. An example of a solution used to clean the wafer is a mixture of $H_2O_2$—$H_2SO_4$. A dryer dries the wafer surfaces to remove any residual liquids or particles from the wafer surfaces. Self-bonding occurs by placing a face of the cleaned wafer against the face of an oxidized wafer.

Alternatively, a self-bonding process occurs by activating one of the wafer surfaces to be bonded by plasma cleaning. In particular, plasma cleaning activates the wafer surface using a plasma derived from gases such as argon, ammonia, neon, water vapor, and oxygen. The activated wafer surface 2203 is placed against a face of the other wafer, which has a coat of oxidation 2205 thereon. The wafers are in a sandwiched structure having exposed wafer faces. A selected amount of pressure is placed on each exposed face of the wafers to self-bond one wafer to the other.

Alternatively, an adhesive disposed on the wafer surfaces is used to bond one wafer onto the other. The adhesive includes an epoxy, polyimide-type materials, and the like. Spin-on-glass layers can be used to bond one wafer surface onto the face of another. These spin-on-glass ("SOG") materials include, among others, siloxanes or silicates, which are often mixed with alcohol-based solvents or the like. SOG can be a desirable material because of the low temperatures (e.g., 150 to 250° C.) often needed to cure the SOG after it is applied to surfaces of the wafers.

Alternatively, a variety of other low temperature techniques can be used to join the donor wafer to the target wafer. For instance, an electro-static bonding technique can be used to join the two wafers together. In particular, one or both wafer surface(s) is charged to attract to the other wafer surface. Additionally, the donor wafer can be fused to the target wafer using a variety of commonly known techniques. Of course, the technique used depends upon the application.

Figure 11:
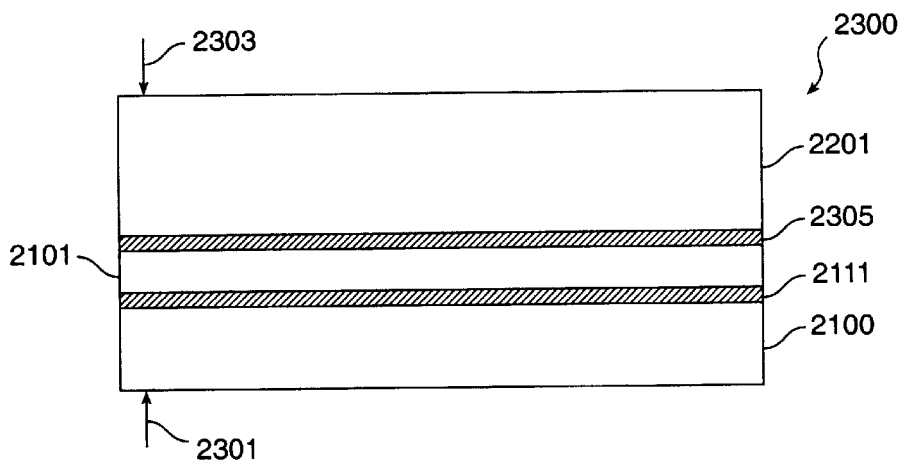
FIGS. 11–15 are simplified cross-sectional view diagrams illustrating a method of forming a silicon-on-insulator substrate according to the present invention.

After bonding the wafers into a sandwiched structure 2300, as shown in FIG. 11, the method includes a controlled cleaving action to remove the substrate material to provide a thin film of substrate material 2101 overlying an insulator 2305 the target silicon wafer 2201. The controlled-cleaving occurs by way of selective energy placement or positioning or targeting 2301, 2303 of energy sources onto the donor and/or target wafers. For instance, an energy impluse(s) can be used to initiate the cleaving action. The impulse (or impulses) is provided using an energy source which include, among others, a mechanical source, a chemical source, a thermal sink or source, and an electrical source.

The controlled cleaving action is initiated by way of any of the previously noted techniques and others and is illustrated by way of FIG. 11. For instance, a process for initiating the controlled cleaving action uses a step of providing energy 2301, 2303 to a selected region of the substrate to initiate a controlled cleaving action at the selected depth ($z_0$) in the substrate, whereupon the cleaving action is made using a propagating cleave front to free a portion of the substrate material to be removed from the substrate. In a specific embodiment, the method uses a single impulse to begin the cleaving action, as previously noted. Alternatively, the method uses an initiation impulse, which is followed by another impulse or successive impulses to selected regions of the substrate. Alternatively, the method provides an impulse to initiate a cleaving action which is sustained by a scanned energy along the substrate. Alternatively, energy can be scanned across selected regions of the substrate to initiate and/or sustain the controlled cleaving action.

Optionally, an energy or stress of the substrate material is increased toward an energy level necessary to initiate the cleaving action, but not enough to initiate the cleaving action before directing an impulse or multiple successive impulses to the substrate according to the present invention. The global energy state of the substrate can be raised or lowered using a variety of sources such as chemical, mechanical, thermal (sink or source), or electrical, alone or in combination. The chemical source can include particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermoelectric heating, and a furnace. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application. As noted, the global source increases a level of energy or stress in the material region without initiating a cleaving action in the material region before providing energy to initiate the controlled cleaving action.

In a preferred embodiment, the method maintains a temperature which is below a temperature of introducing the particles into the substrate. In some embodiments, the substrate temperature is maintained between −200 and 450° C. during the step of introducing energy to initiate propagation of the cleaving action. Substrate temperature can also be maintained at a temperature below 400° C. or below 350° C. In preferred embodiments, the method uses a thermal sink to initiate and maintain the cleaving action, which occurs at conditions significantly below room temperature.

Figure 12:
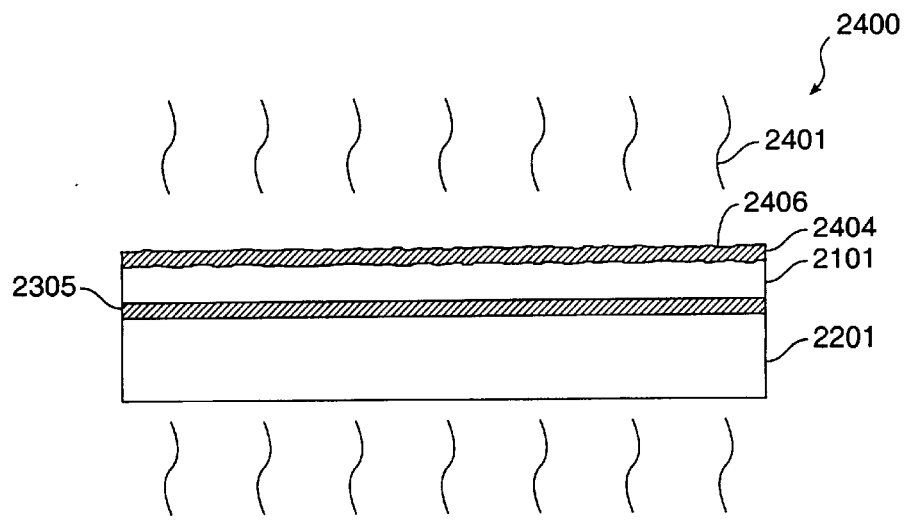

A final bonding step occurs between the target wafer and thin film of material region according to some embodiments, as illustrated by FIG. 12. In one embodiment, one silicon wafer has an overlying layer of silicon dioxide, which is thermally grown overlying the face before cleaning the thin film of material. The silicon dioxide can also be formed using a variety of other techniques, e.g., chemical vapor deposition. The silicon dioxide between the wafer surfaces fuses together thermally in this process.

In some embodiments, the oxidized silicon surface from either the target wafer or the thin film of material region (from the donor wafer) are further pressed together and are subjected to an oxidizing ambient 2401. The oxidizing ambient can be in a diffusion furnace for steam oxidation, hydrogen oxidation, or the like. A combination of the pressure and the oxidizing ambient fuses the two silicon wafers together at the oxide surface or interface 2305. These embodiments often require high temperatures (e.g., 700° C.).

Alternatively, the two silicon surfaces are further pressed together and subjected to an applied voltage between the two wafers. The applied voltage raises temperature of the wafers to induce a bonding between the wafers. This technique limits the amount of crystal defects introduced into the silicon wafers during the bonding process, since substantially no mechanical force is needed to initiate the bonding action between the wafers. Of course, the technique used depends upon the application.

After bonding the wafers, silicon-on-insulator has a target substrate with an overlying film of silicon material and a sandwiched oxide layer between the target substrate and the silicon film, as also illustrated in FIG. 12. The detached surface of the film of silicon material is often rough 2404 and needs finishing. Finishing occurs using a combination of grinding and/or polishing techniques. In some embodiments, the detached surface undergoes a step of grinding using, for examples, techniques such as rotating an abrasive material overlying the detached surface to remove any imperfections or surface roughness therefrom. A machine such as a "back grinder" made by a company called Disco may provide this technique.

Figure 13:
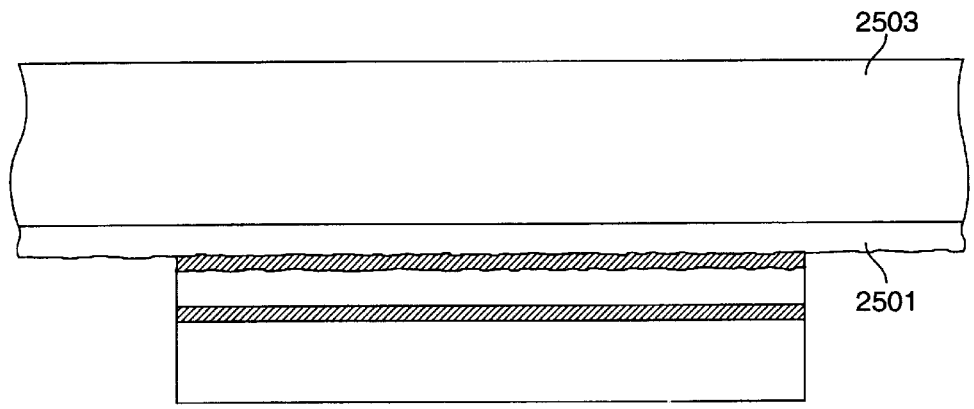

Alternatively, chemical mechanical polishing or planarization ("CMP") techniques finish the detached surface of the film, as illustrated by FIG. 13. In CMP, a slurry mixture is applied directly to a polishing surface 2501 which is attached to a rotating platen 2503. This slurry mixture can be transferred to the polishing surface by way of an orifice, which is coupled to a slurry source. The slurry is often a solution containing an abrasive and an oxidizer, e.g., $H_2O_2$, $KIO_3$, ferric nitrate. The abrasive is often a borosilicate glass, titanium dioxide, titanium nitride, aluminum oxide, aluminum trioxide, iron nitrate, cerium oxide, silicon dioxide (colloidal silica), silicon nitride, silicon carbide, graphite, diamond, and any mixtures thereof. This abrasive is mixed in a solution of deionized water and oxidizer or the like. Preferably, the solution is acidic.

Figure 14:
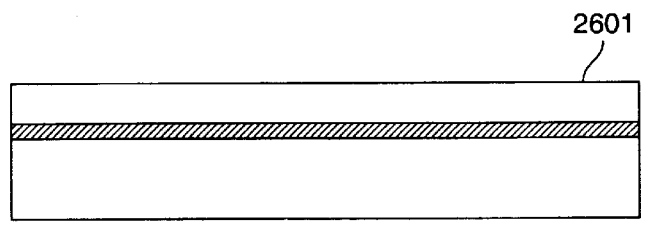

This acid solution generally interacts with the silicon material from the wafer during the polishing process. The polishing process preferably uses a polyurethane polishing pad. An example of this polishing pad is one made by Rodel and sold under the tradename of IC-1000. The polishing pad is rotated at a selected speed. A carrier head which picks up the target wafer having the film applies a selected amount of pressure on the backside of the target wafer such that a selected force is applied to the film. The polishing process removes about a selected amount of film material, which provides a relatively smooth film surface 2601 for subsequent processing, as illustrated by FIG. 14.

In certain embodiments, a thin film of oxide 2406 overlies the film of material overlying the target wafer, as illustrated in FIG. 12. The oxide layer forms during the thermal annealing step, which is described above for permanently bonding the film of material to the target wafer. In these embodiments, the finishing process is selectively adjusted to first remove oxide and the film is subsequently polished to complete the process. Of course, the sequence of steps depends upon the particular application.

Figure 15:
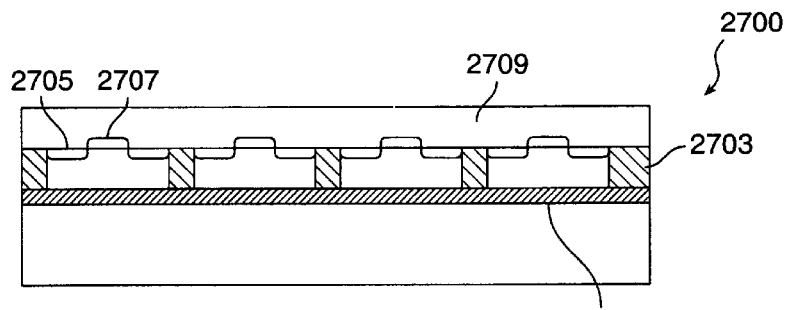

In a specific embodiment, the silicon-on-insulator substrate undergoes a series of process steps for formation of integrated circuits thereon. These processing steps are described in S. Wolf, Silicon Processing for the VLSI Era (Volume 2), Lattice Press (1990), which is hereby incorporated by reference for all purposes. A portion of a completed wafer 2700 including integrated circuit devices is illustrated by FIG. 15. As shown, the portion of the wafer 2700 includes active devices regions 2701 and isolation regions 2703. The active devices are field effect transistors each having a source/drain region 2705 and a gate electrode 2707. A dielectric isolation layer 2709 is defined overlying the active devices to isolate the active devices from any overlying layers.

Additional films may be separated from the donor substrate. For some applications, the surface of the donor substrate does not need preparation after a thin film has been cleaved off and before subsequent implantation and cleaving steps occur. In other applications, it is beneficial to prepare the surface of the donor substrate prior to repeating the cleaving sequence.

Figure 16:
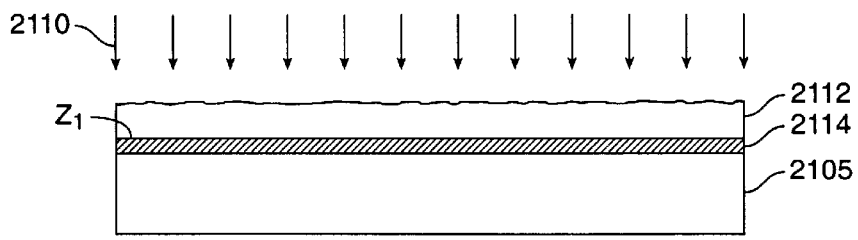
FIGS. 16–19 are simplified diagrams illustrating a method of separating a second layer of material from a substrate.

FIGS. 16 to 19 illustrate using a single donor substrate to produce multiple thin films. FIG. 16 shows the donor substrate 2105 after a thin film of material has been removed, as described above. An implant of second particles 2110 has a desired concentration at a second selected depth $z_1$ to form a second material region 2112 to be removed. The second material region may be removed as a thin film following a process as described above, such as a controlled cleavage process, a blister separation process, as well as others.

Figure 17:
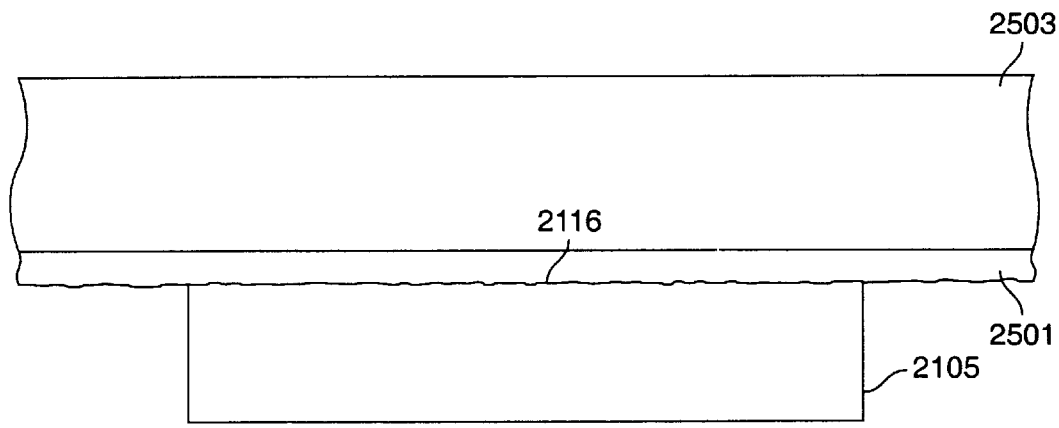

FIG. 17 shows the donor substrate 2105 being polished to improve the surface finish of a cleaved surface 2116 prior to cleaving a second thin film of material from the donor substrate. The polishing operation is similar to that described above for polishing a surface of a separated film, and is generally done before the second implanting step.

Figure 18:
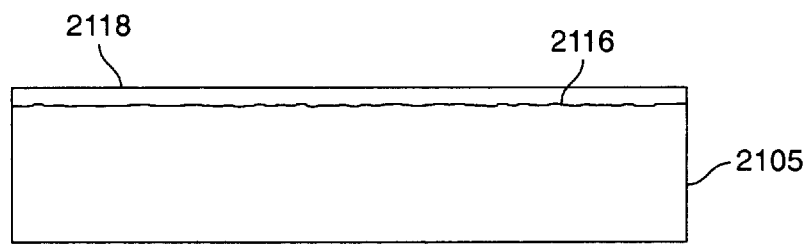

FIG. 18 shows the donor substrate 2105 after a planarizing layer 2118 has been applied to the cleaved surface 2116. The planarizing layer may be a layer of plasma-etched deposited oxide, for example, spin-on glass, polyimide, or similar material. Preparing the surface of the donor substrate with a planarized layer of oxide or polymer prior to cleaving a subsequent thin film is desirable in some applications, especially when using a transfer wafer or backing substrate. It is not necessary to polish the donor wafer prior to implantation, and the planarized surface of the deposited oxide or other materials provides a surface for bonding the donor wafer to a transfer wafer by planarizing the minor surface imperfections of the cleaved surface of the donor wafer. Planarizing the donor wafer in this fashion allows a donor substrate to be re-used within a clean room environment, rather than sending the donor substrate out to be polished after each thin film has been cleaved.

For example, one process according to the present invention for fabricating multiple thin films from a single donor wafer using a wafer bonding technique is described below:

(1) Provide a donor wafer;

(2) Implant particles into the wafer to define a first layer between a surface of the wafer and the particles;

(3) Bond the surface of the donor wafer to a first transfer wafer;

(4) Cleave a first thin film from the donor substrate, where the first thin film adheres to the second transfer wafer;

(5) Deposit a planarized layer of silicon oxide on a cleaved surface of the donor wafer. Optionally, a layer of thermal oxide may be grown prior to the deposition and/or the donor substrate may be thermally treated to improve the crystalline quality of the silicon;

(6) Implant additional particles into the wafer to define a second layer between the surface of the oxide layer and the particles;

(7) Bond the surface of the donor wafer to a second transfer wafer; and (8) Cleave a second thin film from the donor substrate, the second thin film adhering to the second transfer wafer.

Figure 19:
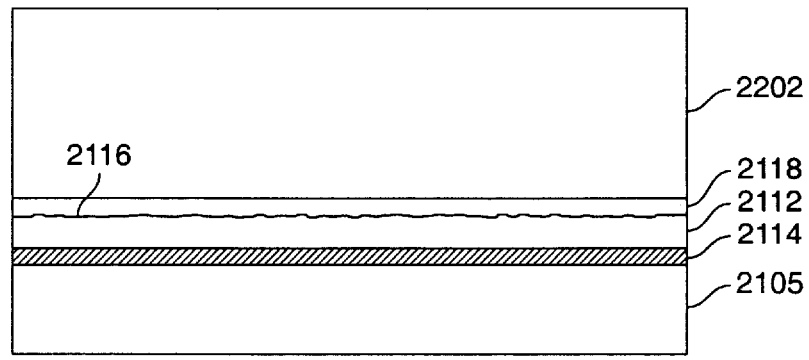

FIG. 19 is a simplified cross section of a substrate 2105 that with a second region of material 2112 to be separated from the substrate. A planarizing layer 2118 has been applied to the cleaved surface 2116 to prepare it for bonding to the target wafer 2202. The planarizing layer provides a good surface for a wafer bonding process, as described above.

Although the above description is in terms of a silicon wafer, other substrates may also be used. For example, the substrate can be almost any monocrystalline, polycrystalline, or even amorphous type substrate. Additionally, the substrate can be made of III/V materials such as gallium arsenide, gallium nitride (GaN), and others. The multi-layered substrate can also be used according to the present invention. The multi-layered substrate includes a silicon-on-insulator substrate, a variety of sandwiched layers on a semiconductor substrate, and numerous other types of substrates. Additionally, the embodiments above were generally in terms of providing a pulse of energy to initiate a controlled cleaving action. The pulse can be replaced by energy that is scanned across a selected region of the substrate to initiate the controlled cleaving action. Energy can also be scanned across selected regions of the substrate to sustain or maintain the controlled cleaving action. One of ordinary skill in the art would easily recognize a variety of alternatives, modifications, and variations, which can be used according to the present invention.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A semiconductor substrate device comprising:
 a donor wafer having a cleaved surface; and
 a layer of particles disposed within said donor wafer a selected distance from and substantially parallel to said cleaved surface to define a layer of donor wafer material between said layer of particles and said cleaved surface.

2. The device of claim 1 wherein the cleaved surface is polished.

3. The device of claim 1 further comprising a dielectric layer disposed on said cleaved surface.

4. The device of claim 3 wherein the dielectric layer is planarized.

5. The device of claim 3 wherein the dielectric layer is spin-on glass.

6. The device of claim 3 wherein the dielectric layer is plasma-deposited silicon oxide.

7. The device of claim 3 wherein the donor wafer is a single-crystal silicon wafer.

8. The device of claim 1 wherein the selected distance is less than fifteen microns.

9. A semiconductor substrate device comprising:
 a single-crystal silicon donor wafer having a cleaved surface approximately parallel to a major crystallographic plane; and
 a layer of particles implanted into said donor wafer through said cleaved surface a selected distance from said cleaved surface to define a layer of donor wafer material between said layer of particles and said cleaved surface.

10. The device of claim 9 wherein said particles are hydrogen ions.

11. The device of claim 10 wherein said hydrogen ions are implanted using plasma-immersion ion implantation.

12. The device of claim 9 wherein the major crystallographic plane is a {100} plane.

13. The device of claim 9 wherein the major crystallographic plane is a {110} plane.

14. The device of claim 9 wherein the major crystallographic plane is a {111} plane.

15. The device of claim 9 wherein an as-grown defect density of the cleaved surface has been reduced to an annealed defect density by a thermal treatment of the donor wafer.

* * * * *